(12) United States Patent
Wu et al.

(10) Patent No.: US 11,317,506 B2
(45) Date of Patent: Apr. 26, 2022

(54) CIRCUIT BOARD WITH HIGH LIGHT REFLECTIVITY AND METHOD FOR MANUFACTURING THE SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Jin-Cheng Wu, Huai an (CN); Mei-Hua Huang, Shenzhen (CN); Ning Hou, Shenzhen (CN); Hua-Ning Wang, Shenzhen (CN); Qiang Song, Shenzhen (CN); Rong-Chao Li, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/036,574

(22) Filed: Sep. 29, 2020

(65) Prior Publication Data
US 2021/0410279 A1 Dec. 30, 2021

(30) Foreign Application Priority Data

Jun. 24, 2020 (CN) .......................... 202010592598.3
Sep. 23, 2020 (CN) ......................... 202011009995.X

(51) Int. Cl.
*H05K 1/02* (2006.01)
*H05K 3/46* (2006.01)
(Continued)

(52) U.S. Cl.
CPC ........... *H05K 1/0274* (2013.01); *H05K 3/429* (2013.01); *H05K 3/4602* (2013.01);
(Continued)

(58) Field of Classification Search
CPC .................................................. H05K 1/0274
(Continued)

(56) References Cited

U.S. PATENT DOCUMENTS 6,137,687 A * 10/2000 Shirai ............... H01L 23/49855
361/749
2008/0149960 A1* 6/2008 Amo ..................... H01L 33/486
257/98
(Continued)

*Primary Examiner* — Stanley Tso
(74) *Attorney, Agent, or Firm* — ScienBiziP, P.C.

(57) ABSTRACT

A circuit board with high light reflectivity includes an inner wiring base board, a base board with a high light reflectivity, a first insulation layer, a first conductor layer, and a second insulation layer. A first opening in the inner wiring base board receives the base board. The first insulation layer is stacked on a surface of the inner wiring base board and defines a second opening corresponding in position to the first opening and exposing a portion of the base board. The first conductor layer is on a surface of the first insulation layer away from the inner wiring base board and includes connecting pads on the base board. The second insulation layer and the second conductor are stacked in that order on another surface of the inner wiring base board. A method for manufacturing the circuit board is also disclosed.

8 Claims, 7 Drawing Sheets

(51) Int. Cl.
*H05K 3/42* (2006.01)
*H05K 1/03* (2006.01)
*H05K 1/18* (2006.01)
*H05K 1/09* (2006.01)

(52) U.S. Cl.
CPC ............ *H05K 1/0366* (2013.01); *H05K 1/09* (2013.01); *H05K 1/181* (2013.01); *H05K 2201/10106* (2013.01); *H05K 2203/0723* (2013.01)

(58) Field of Classification Search
USPC .......................................................... 174/257
See application file for complete search history.

(56) References Cited

U.S. PATENT DOCUMENTS

| | | | | |
|---|---|---|---|---|
| 2011/0298126 | A1* | 12/2011 | Tsai | .................... H01L 23/3128 |
| | | | | 257/738 |
| 2013/0156374 | A1* | 6/2013 | Wu | ...................... G02B 6/4201 |
| | | | | 385/33 |
| 2015/0194585 | A1* | 7/2015 | Kim | ........................ H01L 33/62 |
| | | | | 257/99 |

* cited by examiner

CIRCUIT BOARD WITH HIGH LIGHT REFLECTIVITY AND METHOD FOR MANUFACTURING THE SAME

FIELD

The subject matter herein generally relates to circuit boards, in particular to a circuit board with a high light reflectivity and a method for manufacturing the same.

BACKGROUND

In the production of a mini-LED backlight, a LED lamp can be surface-mounted on a circuit board. The higher the light reflectivity of the circuit board, the higher the light emitting efficiency of the LED lamp. To improve the light emitting efficiency of the LED lamp, a solder mask with a high light reflectivity can be placed to cover surfaces of the circuit board. However, a base board layer in an area for mounting the LED lamp has a low light reflectivity which is inconsistent with the light reflectivity of the outer solder mask, which affects the light emitting efficiency and the light emitting uniformity of the mini-LED backlight.

BRIEF DESCRIPTION OF THE DRAWINGS

Implementations of the present disclosure will now be described, by way of embodiments, with reference to the attached figures.

DETAILED DESCRIPTION

Figure 1:
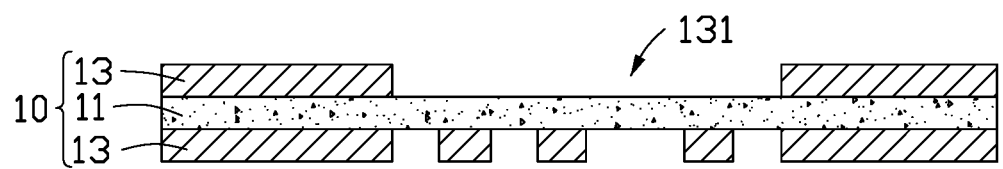
FIG. 1 is a cross-sectional view of an inner wiring base board in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIGS. 1 to 7 illustrate a method for manufacturing a circuit board in accordance with an embodiment. The circuit board has a high light reflectivity. The method includes the following steps S1 to S4.

In step S1, referring to FIG. 1, an inner wiring base board 10 is provided.

The inner wiring base board 10 includes an insulation layer 11 and two inner conductor layers 13 on opposite surfaces of the insulation layer 11. One inner conductor layer 13 defines a first opening 131 and the insulation layer 11 is exposed in the first opening 131.

A material of the insulation layer 11 may be, but is not limited to, prepreg (PP) including glass fiber and epoxy resin, polyimide, polyethylene terephthalate, or polyethylene naphthalate. In the embodiment, the material of the insulation layer 11 is the prepreg including glass fiber and epoxy resin.

A material of the inner conductor layer 13 may be, but is not limited to, metal, such as copper, silver, or an alloy thereof. In the embodiment, the material of the inner conductor layer 13 is copper.

Specifically, step S1 provides a double-sided copper clad laminate including the insulation layer 11 and two copper layer on opposite surfaces of the insulation layer 11. The double-sided copper clad laminate is machine-drilled to form a through hole, the through hole is plated or conductive material is infilled in the through hole. An image transfer process and an etching process are also performed.

Figure 2:
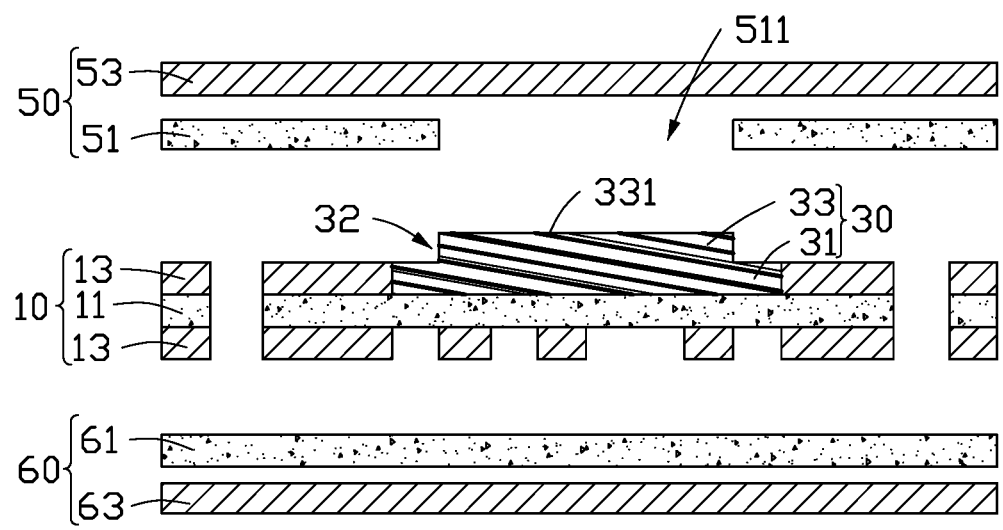
FIG. 2 is a cross-sectional view showing a first wiring base board and a second wiring base board provided on two sides of the inner wiring base board of FIG. 1.
Figure 3:
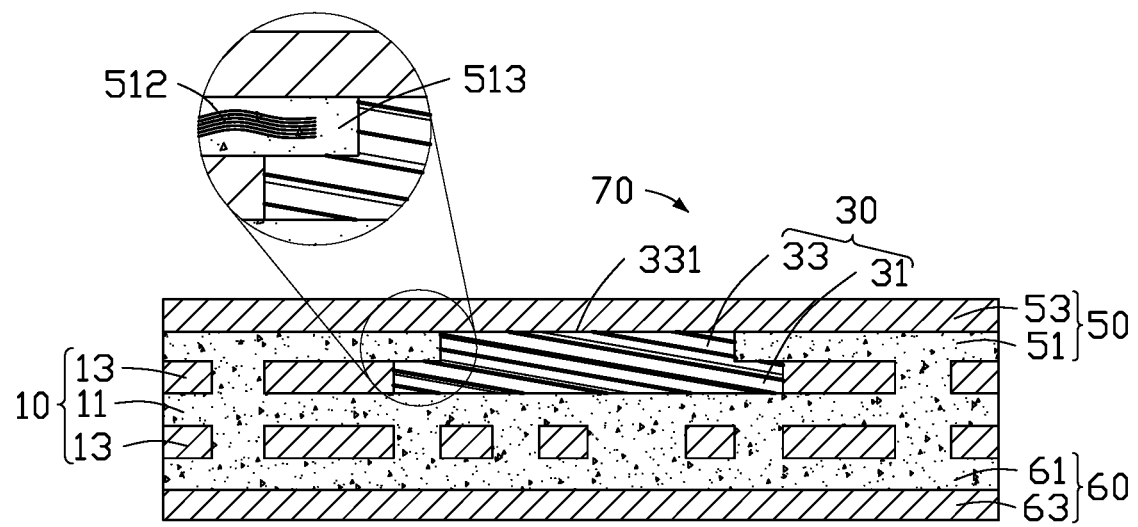
FIG. 3 is a cross-sectional view of a laminated structure formed by pressing the first base, the second wiring base board, and the inner wiring base board of FIG. 2 together.

In step S2, referring to FIGS. 2 and 3, a base board 30 with a high light reflectivity is fixed in the first opening 131, and a first wiring base board 50 and a second wiring base board 60 are pressed onto opposite surfaces of the inner wiring base board 10, thereby obtaining a laminated structure 70. The base board 30 is embedded in the laminated structure 70.

The first wiring base board 50 faces the base board 30. The first wiring base board 50 includes a first insulation layer 51 and a first metal layer 53 stacked on the first insulation layer 51. The first insulation layer 51 defines a second opening 511 corresponding in position to the first opening 131. The first insulation layer 51 covers one inner conductor layer 13, and at least a portion of the base board 30 is exposed in the second opening 511. The first metal layer 53 covers the first insulation layer 51 and the base board 30.

The second wiring base board 60 includes a second insulation layer 61 and a second metal layer 63. The second insulation layer 61 covers the other inner conductor layer 13 and is connected to the insulation layer 11.

A material of the first insulation layer 51 and a material of the second insulation layer 61 may both be, but not limited to, prepreg (PP) including glass fiber and epoxy resin, polyimide, polyethylene terephthalate, or polyethylene naphthalate. In the embodiment, the material of the first insulation layer 51 is the prepreg including glass fiber 512 and epoxy resin 513. A material of the first metal layer 53 and a material of the second metal layer 53 may both be, but not limited to, copper, silver, or an alloy thereof. In the embodiment, materials of the first metal layer 53 and the second metal layer 63 are copper.

The base board 30 is substantially the shape of an inverted T. The base board 30 includes a plate portion 31 and a protrusion portion 33 protruding from a side of the plate portion 31. The plate portion 31 is received in the first opening 131. A size of the plate portion 31 is matched with a size of the first opening 131, so that an edge of the plate portion 31 is in contact with a sidewall of the first opening 131. In the embodiment, a thickness of the plate portion 31 is the same as a depth of the first opening 131, so that a surface of the plate portion 31 away from the insulation layer 11 is flush with a surface of the inner conductor layer 13 away from the insulation layer 11, the inner conductor layer 13 having the first opening 131.

The size of the protrusion portion 33 is matched with the size of the second opening 511, so that the protrusion portion 33 can be pressed through the second opening 511. The protrusion portion 33 includes a mounting surface 331 away from the plate portion 31. An edge of the protrusion portion 33 is a predetermined distance from an edge of the plate portion 31 to form a dam structure 32, the dam structure 32 prevents the molten epoxy resin from flowing to the mounting surface 331 when the first insulation layer 51 is pressed. After being pressed, the first insulation layer 51 covers one inner conductor layer 13, the glass fiber 512 is not in contact with the base board 30, and the epoxy resin 513 infills the dam structure 32. The surface of the first insulation layer 51 away from the inner wiring base board 13 is flush with the mounting surface 331 of the protrusion portion 33.

A material of the base board 30 may be, but not limited to, ceramic. In some embodiments, a reflectivity of the base board 30 is about 92% to 97%.

Figure 4:
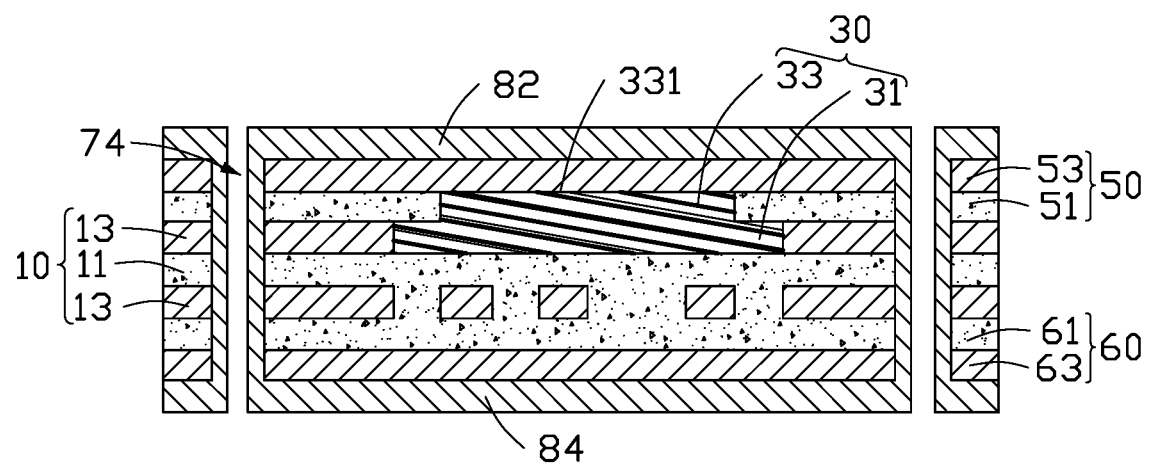
FIG. 4 is a cross-sectional view showing a conductive hole formed on the laminated structure of FIG. 3.
Figure 5:
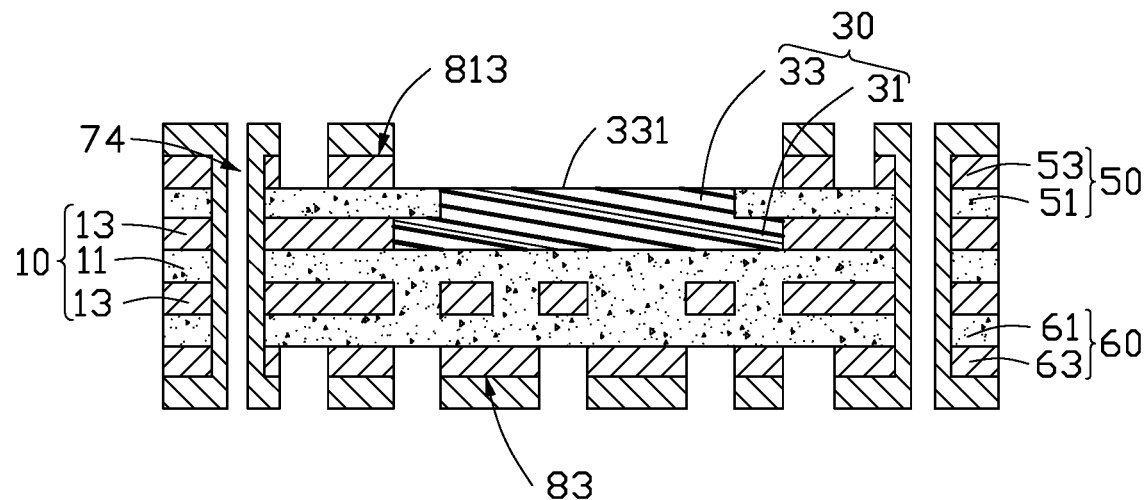
FIG. 5 is a cross-sectional view showing outer conductor layers formed on the structure shown in FIG. 4.
Figure 6:
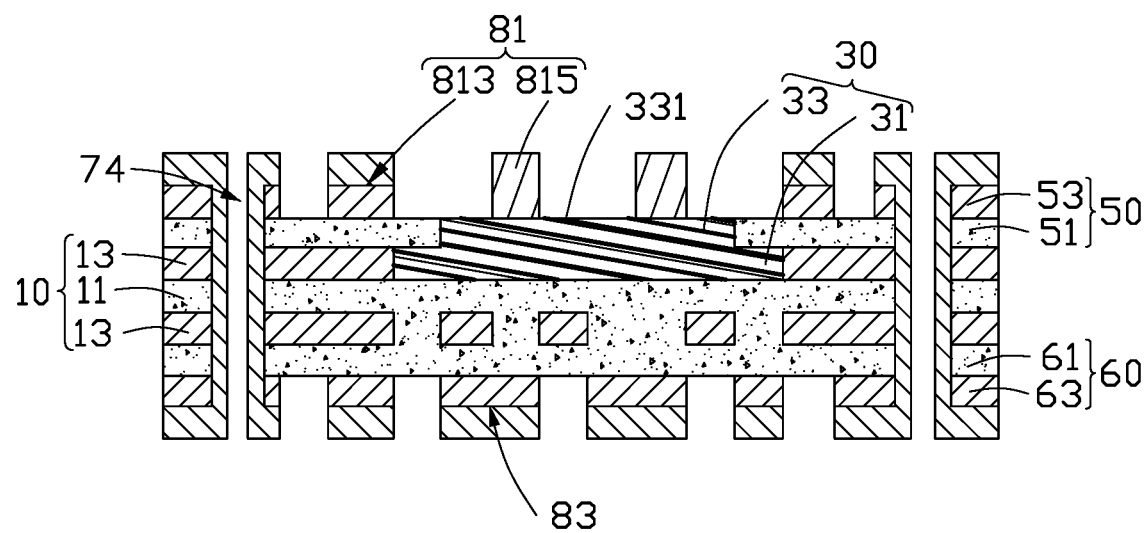
FIG. 6 is a cross-sectional view showing connecting pads formed on the structure shown in FIG. 5.

In step S3, referring to FIGS. 4 to 6, a first conductor layer 81 and a second conductor layer 83 are formed on opposite surfaces of the laminated structure 70. The first conductor layer 81 includes a plurality of circuit patterns 813 and a plurality of connecting pads 815. The circuit patterns 813 are located on the insulation layer 51. The connecting pads 815 are on the mounting surface 331 and are electrically connected to the circuit patterns 813. The second conductor layer 83 is located on the second insulation layer 61. The connecting pads 815 are electrically connected to other electronic elements, such as a light emitting element.

Specifically, step S3 includes steps S31 to S33.

In step S31, a plurality of through holes are formed on the laminated structure 70, the laminated structure 70 is plated to form a first plating layer 82, a second plating layer 84, and a plurality of conductive holes 74. Each of the conductive holes 74 connects the first plating layer 82, the second plating layer 84, and the two inner conductor layers 13. The first plating layer 82 covers a surface of the first metal layer 53 away from the second metal layer 63. The second plating layer 84 covers a surface of the second metal layer 63 away from the first metal layer 53. The conductive holes 74 are formed by plating the through holes.

Each through hole forming a conductive hole 74 penetrates opposite surfaces of the laminated structure 70. The through holes may be formed by laser cutting, mechanizing drilling, or the like. The number of through holes may be set according to needs. In the embodiments, there are two through holes located adjacent to opposite sides of the base board 30.

The material used for electroplating may be, but not limited to, copper, silver, or alloys thereof. In the embodiment, the material used for electroplating is copper.

In step S32, the first plating layer 82 and the first metal layer 53 are etched to form a plurality of circuit patterns 813, and the second plating layer 84 and the second metal layer 63 are etched to form the second conductor layer 83. Each of the circuit patterns 813 includes the first plating layer 82 and the first metal layer 53. The mounting surface 331 is exposed outside the circuit patterns 813.

In step S33, a plurality of connecting pads 815 are formed on the mounting surface 331. The connecting pads 815 may be formed by a modified semi-additive process well known in the art. In the embodiment, the material of the connecting pads 815 is copper.

Figure 7:
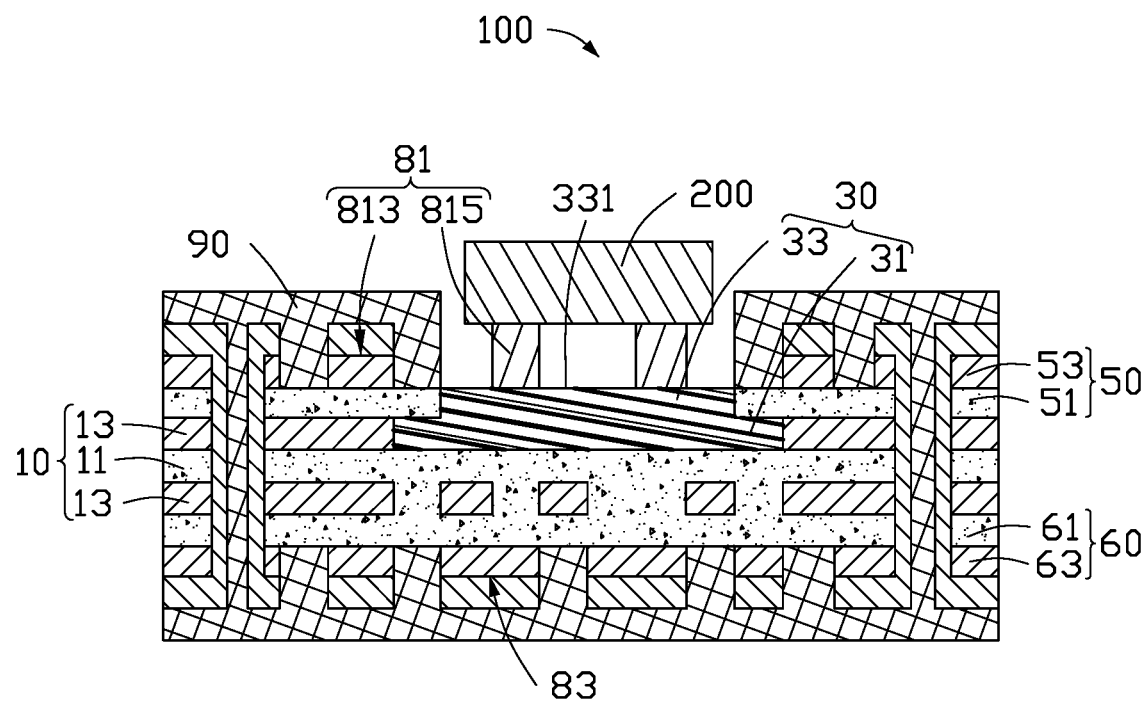
FIG. 7 is a cross-sectional view showing a solder mask formed on the structure shown in FIG. 6.

In step S4, referring to FIG. 7, solder masks 90 are formed on outer surfaces of the first conductor layer 81 and the second conductor layer 83. The mounting surface 331 is exposed outside the solder masks 90. The connecting pads 815 on the mounting surface 331 are electrically connected to a light emitting element 200.

The solder masks 90 covers all of the exposed surfaces of the circuit patterns 813, the first insulation layer 51, the second conductor layer 83, and the second insulation layer 61, and infills the conductive holes 74. The solder masks 90 may be formed by a photolithography process with materials having a high light reflectivity. In some embodiments, the solder masks 90 have a light reflectivity of about 92% to 95%.

FIG. 7 illustrates an embodiment of a circuit board 100 with a high light reflectivity. The circuit board 100 includes an inner wiring base board 10, a base board 30 with a high light reflectivity, a first insulation layer 51, a first conductor layer 81, a second insulation layer 61, and a second conductor layer 83. The inner wiring base board 10 defines a first opening 131, and the base board 30 is fixed in the first opening 131. The first insulation layer 51 is stacked on a surface of the inner wiring base board 10 and defines a second opening 511 corresponding in position to the first opening 131. At least a portion of the base board 30 is exposed in the second opening 511. The first conductor layer 81 is located on a surface of the first insulation layer 51 away from the inner wiring base board 10 and includes a plurality of connecting pads 815 arranged on the base board 30. The second insulation layer 61 is stacked on the other surface of the inner wiring base board 10, and the second conductor layer 83 is located on the surface of the second insulation layer 61 away from the inner wiring base board 10.

The inner wiring base board 10 includes an insulation layer 11 and two inner conductor layers 13 on opposite surfaces of the insulation layer 11. One inner conductor layer 13 defines a first opening 131, the insulation layer 11 is exposed in the first opening 131.

A material of the insulation layer 11 may be, but not limited to, prepreg (PP) including glass fiber and epoxy resin, polyimide, polyethylene terephthalate, or polyethylene naphthalate. In the embodiment, the material of the insulation layer 11 is the prepreg including glass fiber and epoxy resin.

A material of the first insulation layer 51 and a material of the second insulation layer 61 may both be, but not limited to, prepreg (PP) including glass fiber and epoxy resin, polyimide, polyethylene terephthalate, or polyethylene naphthalate. In the embodiment, the material of the first insulation layer 51 is the prepreg including glass fiber 512 and epoxy resin 513. Materials of the inner conductor layers 13, the first conductor layer 81, and the second conductor layer 83 may be copper, silver, or alloy thereof. In the embodiment, the materials of the inner conductor layers 13 and the first conductor layer 81 are all copper.

The base board 30 is substantially an inverted T in shape. The base board 30 includes a plate portion 31 and a protrusion portion 33 protruding from a side of the plate portion 31. The plate portion 31 is received in the first opening 131. A size of the plate portion 31 is matched with a size of the first opening 131, so that an edge of the plate portion 31 is in contact with a sidewall of the first opening 131. In the embodiment, a thickness of the plate portion 31 is the same as a depth of the first opening 131, so that a surface of the plate portion 31 away from the insulation layer 11 is flush with a surface of the inner conductor layer 13 away from the insulation layer 11, the inner conductor layer having the first opening 131.

The size of the protrusion portion 33 is matched with the size of the second opening 511, so that the protrusion portion 33 can be pressed through the second opening 511. The protrusion portion 33 includes a mounting surface 331 away from the plate portion 31. An edge of the protrusion portion 33 is a predetermined distance from an edge of the plate portion 31 to form a dam structure 32, the dam structure 32 prevents the molten epoxy resin from flowing to the mounting surface 331 when the first insulation layer 51 is pressed. The glass fiber 512 is not in contact with the base board 30, and the epoxy resin 513 infills the dam structure 32. The surface of the first insulation layer 51 away from the inner wiring base board 13 is flush with the mounting surface 331 of the protrusion portion 33.

A material of the base board 30 may be, but is not limited to, ceramic. In some embodiments, a light reflectivity of the base board 30 is about 92% to 97%.

The first conductor layer 81 further includes a plurality of circuit patterns 813, the circuit patterns 813 are located on the first insulation layer 51. Each of the circuit patterns 813 includes the first plating layer 82 and the first metal layer 53. The mounting surface 331 is exposed outside the circuit patterns 813.

The connecting pads 815 are located on the mounting surface 331 and are electrically connected to the circuit patterns 813.

In some embodiments, the circuit board 100 further includes a plurality of conductive holes 74. Each of the conductive holes 74 electrically connects the first conductor layer 81, the second conductor layer 83, and the two inner conductor layers 13.

In some embodiments, the circuit board 100 further includes solder masks 90. The solder masks 90 are arranged on outer surfaces of the first conductor layer 81 and the second conductor layer 83. The mounting surface 331 is exposed outside the solder masks 90. The connecting pads 815 on the mounting surface 331 is electrically connected to a light emitting element 200. The solder masks 90 cover all of the exposed surfaces of the circuit patterns 813, the first insulation layer 51, the second conductor layer 83, and the second insulation layer 61, and infills the conductive holes 74. The solder masks 90 may be formed by a photolithography process with materials with a high reflectivity. In some embodiments, the solder masks 90 have a light reflectivity of about 92% to 95%.

Figure 8:
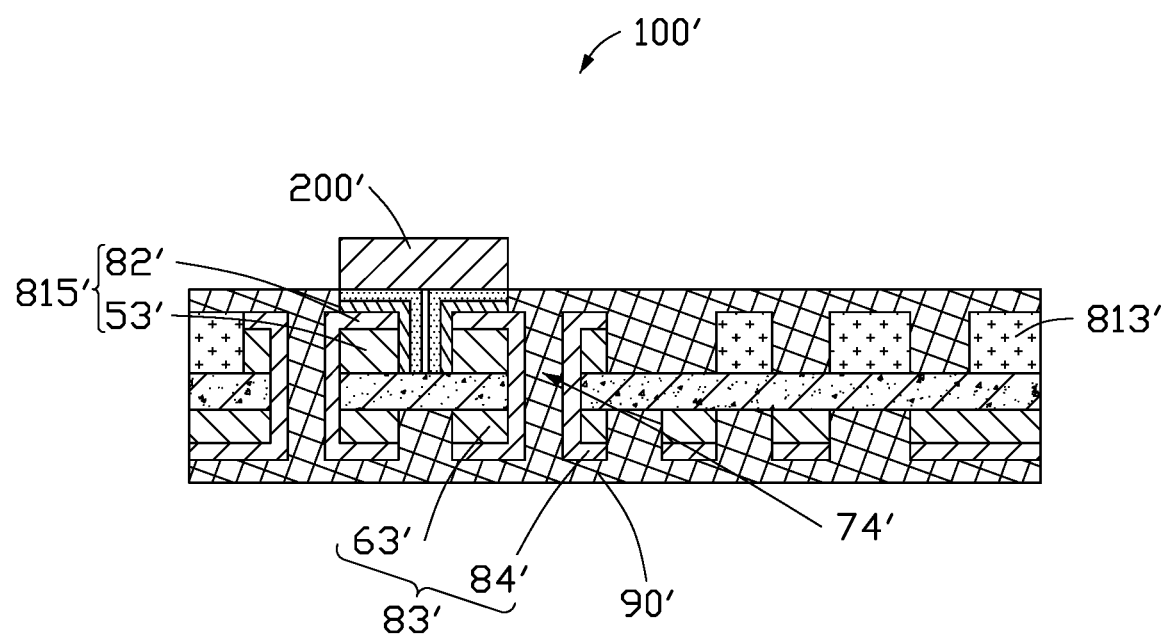
FIG. 8 is a cross-sectional view of a circuit board in accordance with another embodiment.
Figure 9:
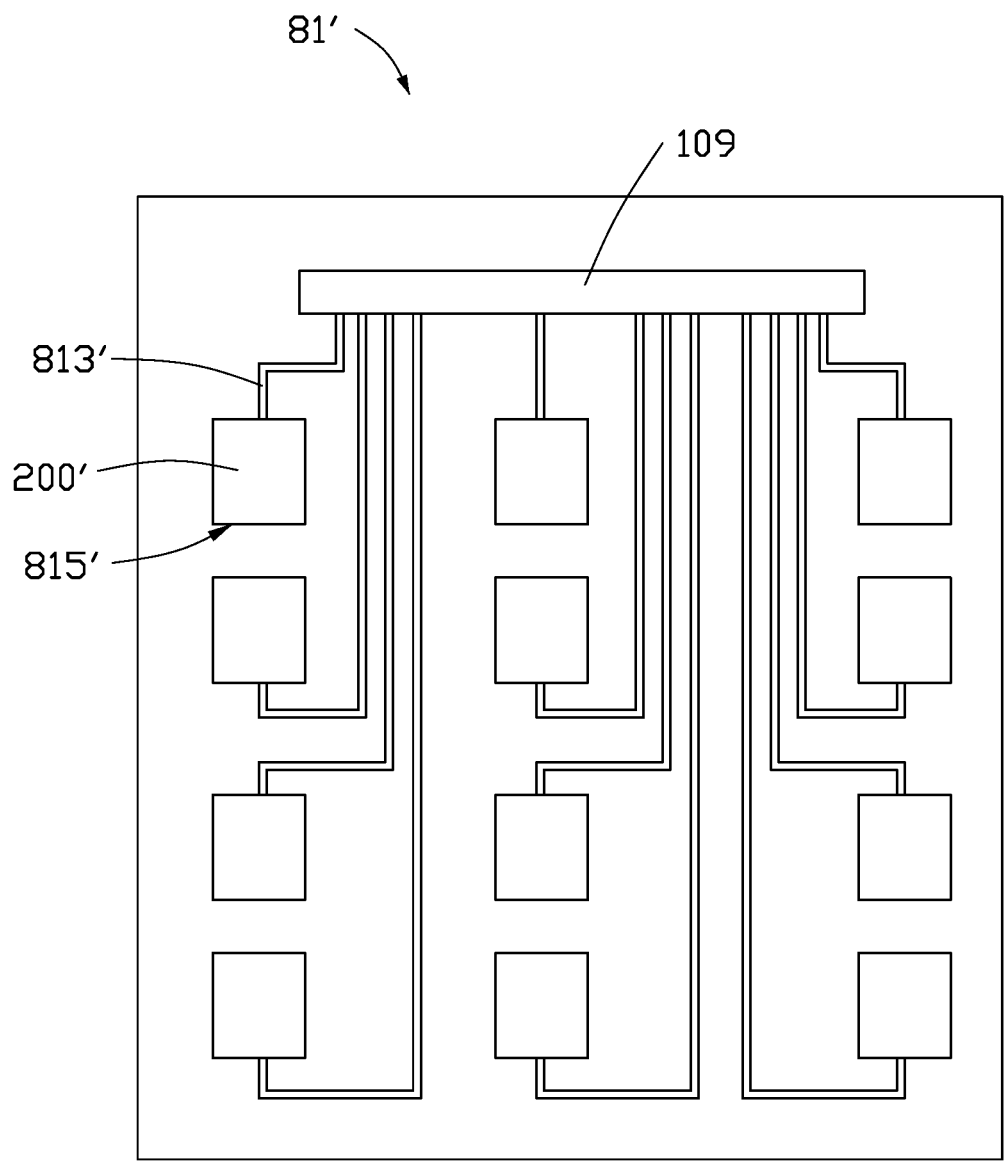
FIG. 9 is a top view of the first conductor layer of the circuit board of FIG. 8.
Figure 10:
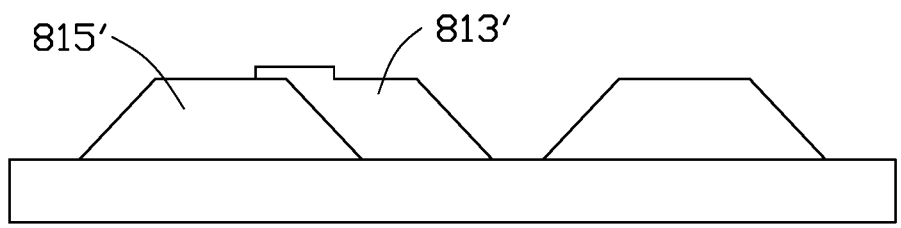
FIG. 10 is a schematic view of the first connecting pad and the circuit pattern of the circuit board of FIG. 8.

FIGS. 8 to 10 illustrate a modified embodiment of the circuit board (circuit board 100'). Each of the connecting pads 815' of the first conductor layer 81' includes the first metal layer 53' and the first plating layer 82', and materials of the first metal layer 53' and the first plating layer 82' are copper. A material of each of the circuit patterns 813' of the first conductor layer 81' includes silver, and a light reflectivity of the circuit patterns 813' is not less than 95%. The light emitting element 200' is electrically connected to a solder pad 109 through the connecting pads 815' and the circuit patterns 813'. Each of the connecting pads 815' may be trapezoidal in shape, and each of the connecting pads 815' may be partially overlapped with a circuit pattern 813'. In other embodiment, the circuit patterns 813' may be formed on other materials with a high light reflectivity. When forming the first conductor layer 81', first, the first plating layer 82' and the first metal layer 53' are etched to form the connecting pads 815', and then a plurality of circuit patterns 813' are formed. The circuit patterns 813' may be formed by curing a silver paste.

In the circuit board 100, the connecting pads 815 for mounting the light emitting element 200 are arranged on the base board 30 which has a high light reflectivity, which improves the light reflectivity of that area, so that the light emitting efficiency of the light emitting element 200 is improved. In addition, the light reflectivity of the base board 30 is approximately the same as the light reflectivity of the solder masks 90, which improves the uniformity of light emission of the light emitting element 200. Furthermore, the circuit patterns 813' are made of a material including silver, so that the circuit patterns 813' have a high light reflectivity.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
   an inner wiring base board defining a first opening;
   a base board fixed in the first opening, wherein a material of the base board is ceramic, and the base board has a high light reflectivity of 92% to 97%;
   a first insulation layer stacked on a surface of the inner wiring base board and defining a second opening corresponding in position to the first opening, at least a portion of the base board being exposed in the second opening;
   a first conductor layer located on a surface of the first insulation layer away from the inner wiring base board and comprising a plurality of connecting pads arranged on the base board;
   a second insulation layer stacked on a surface of the inner wiring base board away from the first insulation layer;
   a second conductor layer located on a surface of the second insulation layer away from the inner wiring base board; and
   a solder mask arranged on an outer side of the first conductor layer, wherein the solder mask has a high light reflectivity of 92% to 95%, the base board is exposed outside the solder mask.

2. The circuit board of claim 1, wherein the base board comprises a plate portion and a protrusion portion formed on the plate portion, the plate portion is received in the first opening, and the protrusion portion is received in the second opening, a surface of the protrusion portion away from the plate portion is flush with a surface of the first insulation layer with the first conductor layer.

3. The circuit board of claim 2, wherein an edge of the protrusion portion is a predetermined distance from an edge of the plate portion to form a dam structure, the first insulation layer comprises glass fiber and epoxy resin, the dam structure is filled with the epoxy resin, and the glass fiber is not in contact with the base board.

4. The circuit board of claim 1, wherein the inner wiring base board comprises an insulation layer and two inner conductor layers arranged on opposite surfaces of the insulation layer, one of the two inner conductor layers defines the first opening exposing the insulation layer.

5. The circuit board of claim 1, wherein the first conductor layer further comprises a plurality of circuit patterns, the plurality of connecting pads are electrically connected to the plurality of circuit patterns.

6. The circuit board of claim 5, wherein each of the plurality of circuit patterns comprises a first plating layer and a first metal layer stacked on the first plating layer, a light reflectivity of the circuit patterns is not less than 95%.

7. The circuit board of claim 5, wherein a material of each of the plurality of circuit patterns comprises silver.

8. The circuit board of claim 7, wherein each of the plurality connecting pads comprises a first plating layer and a first metal layer stacked on the first plating layer.

* * * * *